(12) United States Patent
Notte, IV

(10) Patent No.: US 8,314,403 B2
(45) Date of Patent: Nov. 20, 2012

(54) GAS FIELD ION SOURCE WITH COATED TIP

(75) Inventor: John A. Notte, IV, Gloucester, MA (US)

(73) Assignee: Carl Zeiss NTS, LLC, Dover, DE (US)

( * ) Notice: Subject to any disclaimer, the term of this patent is extended or adjusted under 35 U.S.C. 154(b) by 110 days.

(21) Appl. No.: 12/869,029

(22) Filed: Aug. 26, 2010

(65) Prior Publication Data

US 2011/0001058 A1    Jan. 6, 2011

Related U.S. Application Data

(66) Continuation of application No. PCT/US2009/034000, filed on Feb. 13, 2009, Substitute for application No. 61/033,208, filed on Mar. 3, 2008.

(51) Int. Cl.
*H01J 3/00* (2006.01)

(52) U.S. Cl. ............ 250/423 F; 250/396 R; 250/423 R; 250/424; 250/492.1; 313/346 R

(58) Field of Classification Search ............. 250/396 R, 250/423 R, 424, 423 F, 492.1; 313/346 R
See application file for complete search history.

(56) References Cited

U.S. PATENT DOCUMENTS

| | | | | |
|---|---|---|---|---|
| 3,911,311 A | * | 10/1975 | Heil | 313/230 |
| 4,085,330 A | * | 4/1978 | Wolfe | 250/492.2 |
| 4,551,650 A | * | 11/1985 | Noda et al. | 313/362.1 |
| 4,686,414 A | * | 8/1987 | McKenna et al. | 313/362.1 |
| 2003/0122085 A1 | * | 7/2003 | Stengl et al. | 250/423 F |
| 2005/0174030 A1 | * | 8/2005 | Katsap | 313/346 R |
| 2007/0138388 A1 | | 6/2007 | Ward et al. | |
| 2007/0228287 A1 | | 10/2007 | Ward et al. | |
| 2008/0315089 A1 | * | 12/2008 | Yasuda et al. | 250/306 |
| 2009/0001266 A1 | * | 1/2009 | Frosien | 250/307 |
| 2009/0121148 A1 | * | 5/2009 | Pohl et al. | 250/396 R |

FOREIGN PATENT DOCUMENTS

| | | |
|---|---|---|
| EP | 1 564 774 | 8/2005 |
| EP | 1 947 674 | 7/2008 |
| GB | 2 372 146 | 8/2002 |
| JP | 2009-059618 | 3/2009 |
| WO | WO 01/15192 | 3/2001 |
| WO | WO 2006/103524 | 10/2006 |
| WO | WO 2007/055154 | 5/2007 |

OTHER PUBLICATIONS

Klaus et al., "Development of a high brightness gas field ion source", J. Vac. Sci. Technol. B 15(6), Nov./Dec. 1997, pp. 2365-2368.*
Antczak et al., "Faceting of Pt-covered W, Pt-covered Ir, and Pd-covered Mo eld emitter tips," *Vacuum 63* (2001) 43-51.
Kuo et al., "New Type of Gas Field Ion Source: Noble-Metal/W(111) Pyramidal Single-Atom Tips", IMC16, Sapporo, p. 1120, 2006.
Kuo et al., "Noble Metal/W(111) Single-Atom Tips and Their Field Electron and Ion Emission Characteristics", Japanese Journal of Applied Physics, vol. 45, No. 11, 2006, pp. 8972-8983.
Kuo et al., "Preparation and Characterization of Single-Atom Tips", NanoLetters, Vo. 4, No. 12, 2379-2382 (2004).

(Continued)

*Primary Examiner* — Michael Logie
(74) *Attorney, Agent, or Firm* — Fish & Richardson P.C.

(57) ABSTRACT

Coated tips, as well as related articles, systems and methods are disclosed.

22 Claims, 5 Drawing Sheets

OTHER PUBLICATIONS

Kuo et al., "Preparation of Single-Atom Tips and Their Field Emission Behaviors", Journal of Surface Science and Nanotechnology, Vo. 4 (2006) 233-238.

Rezeq et al., "Sharpening of a Field Ion Microscope (FIM) Tungsten Tip by the Controlled Interaction of Nitrogen with the Tip Surface Atoms," American Physical Society, March Meeting 2004, Mar. 22-26, 2004, Palais des Congres de Montreal, Montreal, Quebec, Canada, Meeting ID: MAR04, abstract #R1.252 (Abstract only).

Rezeq et al., "Tungsten nanotip fabrication by spatially controlled field-assisted reaction with nitrogen" J. Chem. Phys. 124, 204716 (2006).

Song et al., "Faceting of W(11 1) Induced by Ultrathin Pd Films," *Langmuir*, vol. 7, No. 12, 1991.

The International Search Report and a Written Opinion from the counterpart PCT Application No. PCT/US2009/034000, dated Jul. 3, 2009.

* cited by examiner

GAS FIELD ION SOURCE WITH COATED TIP

CROSS-REFERENCE TO RELATED APPLICATIONS

This application is a continuation of, and claims benefit under 35 USC 120 to, international application PCT/US2009/034000, filed Feb. 13, 2009, which claims benefit of U.S. Ser. No. 61/033,208, filed on Mar. 3, 2008. Both of these applications are hereby incorporated by reference in their entirety.

FIELD

The disclosure generally relates to coated tips, as well as related articles, systems and methods.

BACKGROUND

Gas field ion sources are known. Typically, a gas field ion source includes a tip formed of electrically conductive material. During use, the tip can be used to ionize neutral gas species to generate ions by bringing the neutral gas species into the vicinity of the tip while applying a high positive potential to the apex of the tip. The ions can, for example, be formed into a beam that can be used to determine certain properties of a sample and/or to modify the sample.

SUMMARY

The disclosure generally relates to coated tips, as well as related articles, systems and methods.

Applicants discovered that, while a certain amount of corrosion of a gas field ion tip may be desirable in certain instances, it is possible that corrosion of the tip can proceed to an extent where undesirable results can occur. In particular, Applicants discovered that, as tip corrosion occurs, the tip geometry can change, which can cause the field at the apex of the tip to increase to the point where it can exceed the field evaporation strength of the material that forms the tip, resulting in undesirable field evaporation of the atoms at the tip. Without wishing to be bound by theory, Applicants believe that undesirable corrosion can be reduced, and possibly even eliminated, by coating certain portions of the tip without coating other portions of the tip. As an example, Applicants believe that, by coating only a portion of the tip where intermediate values of electric field are achieved during use, tip corrosion can be controlled so that undesirable tip corrosion is limited.

In one aspect, the disclosure features an article that includes a first electrically conductive material and a coating. The article is configured to be used as a tip in a gas field ion source. The coating is supported by the first electrically conductive material only where an average emission current density from the article is at most 50% of a maximum emission current density from the article when the article is being used as the tip in the gas field ion source.

In another aspect, the disclosure provides an article that includes a first electrically conductive material having a surface and a coating. The article is configured to be used as a tip in a gas field ion source. The first electrically conductive material has a surface, and the coating is supported by the first electrically conductive material only where a normal to the surface of the first electrically conductive material is within 60° of an axis normal to an apex of the first electrically conductive material.

In a further aspect, the disclosure provides an article that includes a first electrically conductive material having a surface and a coating. The article is configured to be used as a tip in a gas field ion source. The first electrically conductive material has a surface. The coating is supported by the first electrically conductive material except within a distance of 200 nm of an apex of the first electrically conductive material as measured along the surface of the first electrically conductive material.

In an additional aspect, the disclosure provides a method that includes forming a coating supported by an electrically conductive material, and removing a portion of the coating to provide an article. The article is configured to be used as a tip in a gas field ion source. The coating is supported by the first electrically conductive material only where an average emission current density from the article is at most 50% of a maximum emission current density from the article when the article is being used as the tip in the gas field ion source.

In another aspect, the disclosure provides a method that includes forming a coating supported by a surface of an electrically conductive material, and removing a portion of the coating to provide an article. the article is configured to be used as a tip in a gas field ion source. The first electrically conductive material has a surface. The coating is supported by the first electrically conductive material only where a normal to the surface of the first electrically conductive material within 60° of an axis normal to an apex of the first electrically conductive material.

In a further aspect, the disclosure provides a method that includes forming a coating supported by a surface of an electrically conductive material, and removing a portion of the coating to provide an article. The article is configured to be used as a tip in a gas field ion source. The first electrically conductive material has a surface. The coating is supported by the first electrically conductive material except within a distance of 200 nm of an apex of the first electrically conductive material as measured along the surface of the first electrically conductive material.

In an additional aspect, the disclosure provides an article that includes a first electrically conductive material having an apex, and a coating supported by the first electrically conductive material at a location other than the apex of the first electrically conductive material. The article is configured to be used as a tip in a gas field ion source.

In another aspect, the disclosure provides a method that includes forming a coating supported by a surface of an electrically conductive material having an apex, and removing the coating from the apex of the electrically conductive material to provide an article. The article is configured to be used as a tip in a gas field ion source.

Embodiments can provide one or more of the following advantages.

In some embodiments, the tip can provide enhanced reliability and/or use lifetime. This can, for example, result in improved performance when used as a particle source (e.g., as a source of ions in a gas field ion source, such as a gas field ion source).

In certain embodiments, the tip can be prepared by a process that involves desirable corrosion with little or no undesirable corrosion.

DETAILED DESCRIPTION

I. Tips

Figure 1:
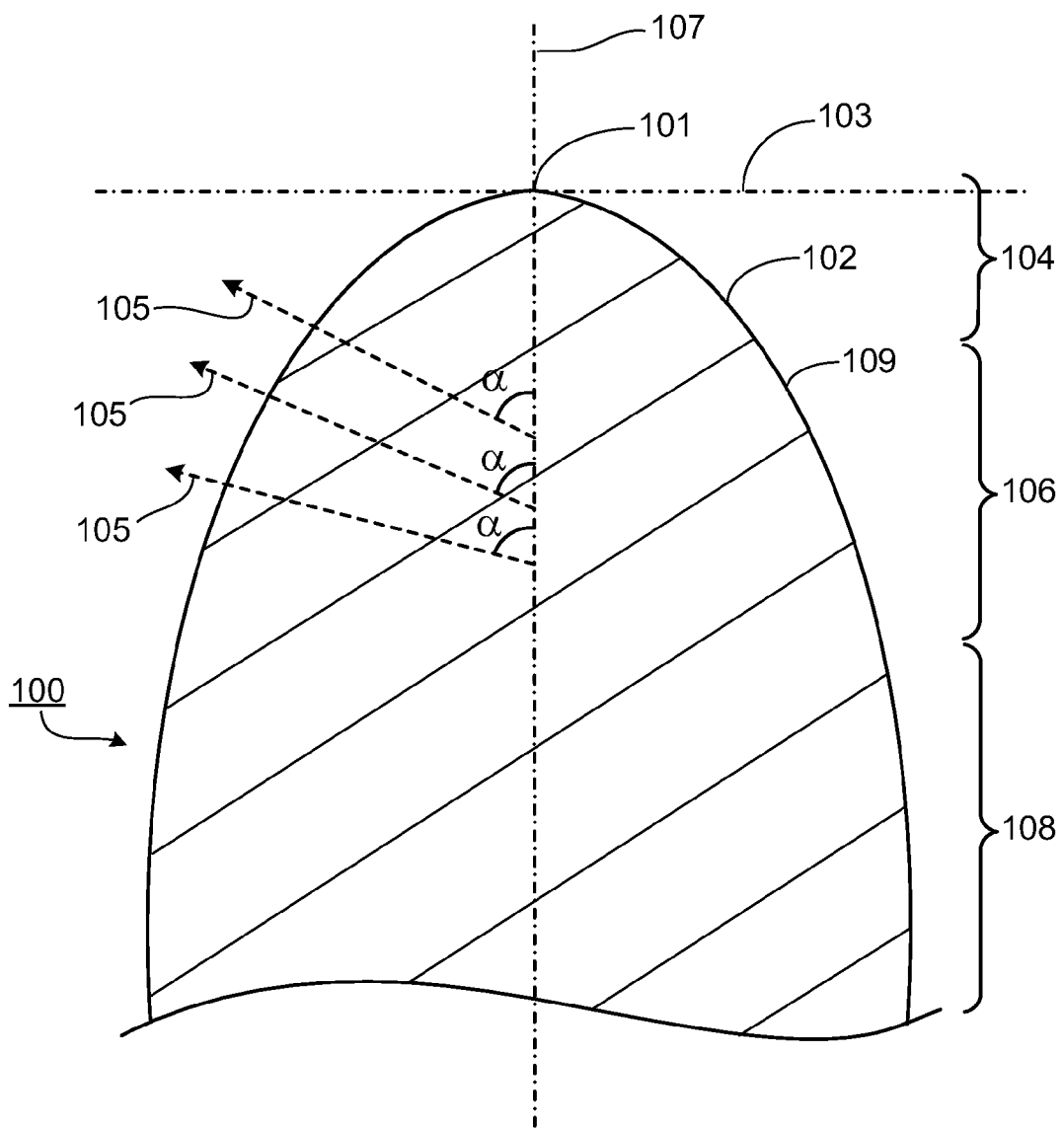
FIG. 1 is a cross-sectional view of a portion of a tip of a gas field ion source.

FIG. 1 is a cross-sectional view of a portion of an electrically conductive tip 100 of a gas field ion source. In general, tip 100 is made of an electrically conductive material, such as carbon, a metal or an alloy. Exemplary metals include gold, silver, palladium, osmium, tungsten, tantalum, iridium, rhenium, niobium, platinum and molybdenum. Exemplary alloys include at least two materials selected from carbon, gold, silver, palladium, osmium, tungsten, tantalum, iridium, rhenium, niobium, platinum and molybdenum.

In certain embodiments, tip 100 can be formed of a single crystal material, such as a single crystal metal. Typically, a particular single crystal orientation of the terminal shelf of atoms of an apex 101 of tip 100 is aligned with a plane 103 which is tangent to the surface at the apex 101 to within 10° or less (e.g., within 5° or less, within 3° or less). In some embodiments, apex 101 of tip 100 can terminate in an atomic shelf having a certain number of atoms (e.g., 20 atoms or less, 15 atoms or less, 10 atoms or less, nine atoms or less, six atoms or less, three atoms or less). For example, apex 101 of tip 100 can be formed of W(111) and can have a terminal shelf with three atoms (a trimer).

In some embodiments, tip 100 can have a terminal shelf that includes fewer than three atoms or more than three atoms. For example, a W(111) tip can have a terminal shelf that includes two atoms, or a terminal shelf that includes only one atom. Alternatively, a W(111) tip can have a terminal shelf that includes four or more atoms (e.g., five or more atoms, six or more atoms, seven or more atoms, eight or more atoms, nine or more atoms, ten or more atoms, more than ten atoms).

Alternatively, or in addition, tip 100 can correspond to a different W crystalline orientation, such as W(112), W(110) or W(100). Such a tip can have terminal shelves that include one or more atoms (e.g., two or more atoms, three or more atoms, four or more atoms, five or more atoms, six or more atoms, seven or more atoms, eight or more atoms, nine or more atoms, ten or more atoms, more than ten atoms).

In some embodiments, tip 100 can be formed from a material other than single crystal W (e.g., a single crystal of a metal, such as a single crystal of one of the metals noted above), and such a tip can have a terminal shelf that includes one or more atoms (e.g., two or more atoms, three or more atoms, four or more atoms, five or more atoms, six or more atoms, seven or more atoms, eight or more atoms, nine or more atoms, ten or more atoms, more than ten atoms).

Tip 100 has a surface 102 with regions 104, 106 and 108. Region 104 has a relatively high average emission current and/or a relatively high average emission current density, and region 108 has a relatively low average emission current and/or a relatively low average emission current density. Region 106 has an intermediate average emission current and/or an intermediate average emission current density that is between that of regions 104 and 108.

In some embodiments, in region 106, an angle α between a normal 105 to surface 102 and an axis 107 that is perpendicular to plane 103 is at most 60° (e.g., at most 45°, at most 30°). In certain embodiments, in region 106, α is at least 15° (e.g., at least 25°, at least 30°). For example, in region 106, α can be from 15° to 60° (e.g., from 15° to 45°, from 15° to 30°, from 25° to 60°, from 25° to 45°, from 25° to 30°, from 30° to 60°, from 30° to 45°).

In some embodiments, the distance from an uppermost point 109 of region 106 to apex 101, as measured along surface 102, is at most 200 nm (e.g., at most 100 nm, at most 50 nm). In certain embodiments, the distance from point 109 to apex 101, as measured along surface 102, is at least 25 nm (e.g., at least 30 nm, at least 40 nm). For example, the distance from an uppermost point 109 of region 106 to apex 101, as measured along surface 102 can be from 25 nm to 200 nm (e.g., from 25 nm to 100 nm, from 25 nm to 50 nm, from 30 nm to 200 nm, from 30 nm to 100 nm, from 30 nm to 50 nm, from 40 nm to 200 nm, from 40 nm to 100 nm, from 40 nm to 50 nm).

Figure 2:
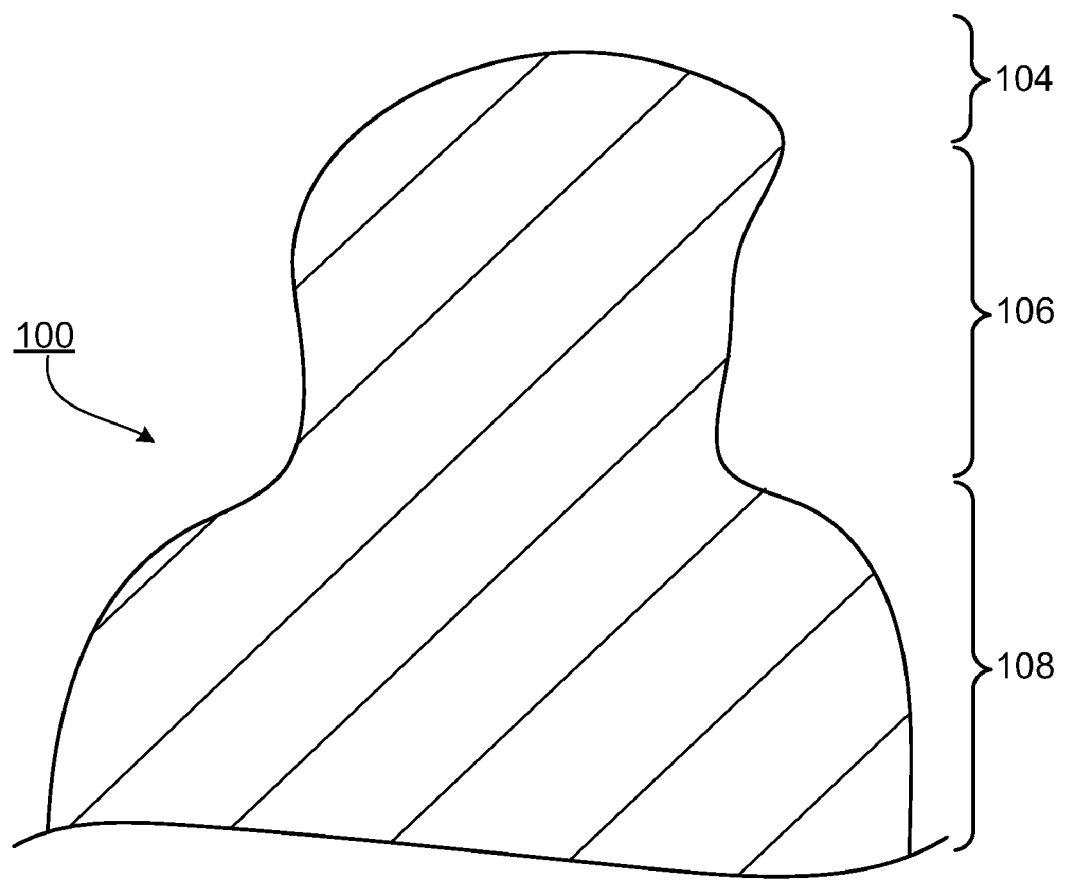
FIG. 2 is a schematic representation of corrosion of the tip of a gas field ion source.

FIG. 2 is a schematic representation of corrosion that can occur to tip 100 during use when a typical, high positive potential is applied to apex. Without wishing to be bound by theory, Applicants believe that in region 108 the electric field is so low that gas atoms can reach region 108, and possible even adsorb to surface 102, but that most of the gas atoms do not undergo ionization and corrosion does not occur. Without wishing to be bound by theory, Applicants believe that in region 104 the electric field is so high that most of the gas atoms are ionized and accelerated away from surface 102 without contacting surface 102. Without wishing to be bound by theory, Applicants believe that in region 106 the electric field is sufficiently strong to attract gas atoms, but that the electric field is not strong enough to cause all the ions to be ionized accelerated away from tip 100 without contacting surface 102. Thus, many of the ions can interact with surface 102 in the region 106. Further, Applicants believe that in region 106 unique chemical reactions can take place on region 106 in the presence of the intermediate electric field which otherwise would not take place.

Figure 3:
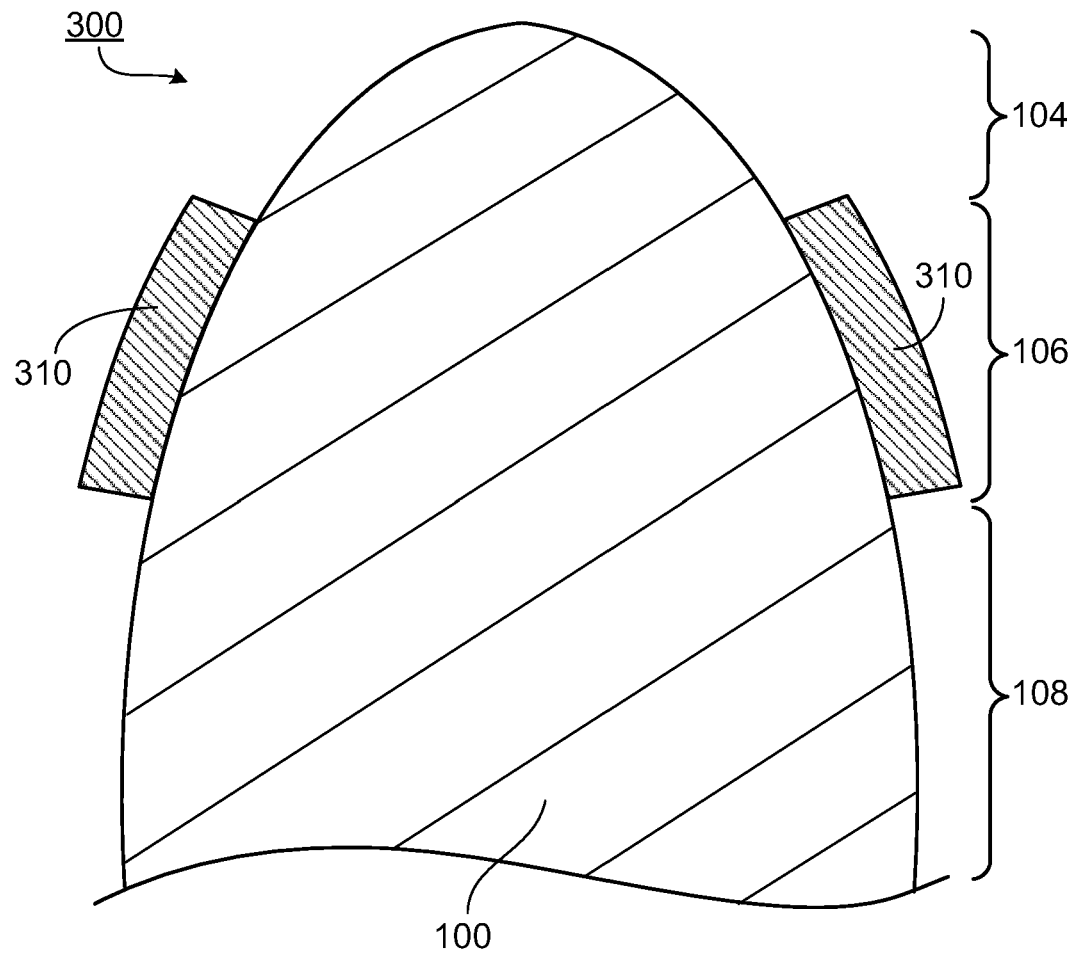
FIG. 3 is a cross-sectional view of a portion of a tip of a gas field ion source having a coating.

FIG. 3 is a cross-sectional view of an article 300 that includes tip 100 and a coating 310 disposed on surface 102 of tip 100 only in region 106.

In some embodiments, the average emission current density of article 300 within region 106 is at most 50% (e.g., at most 25%, at most 10%) of the maximum emission current density of article 300 when article 300 is used as the tip in the gas field ion source, and the average emission current density of article 300 within region 106 is at least 1% (e.g., at least 5%, at least 10%) of the maximum emission current density of article 300 when article 300 is used as the tip in the gas field ion source. In certain embodiments, the average emission current density of article 300 within region 106 is from 1% to 50% (e.g., from 5% to 50%, from 10% to 50%, from 1% to 25%, from 1% to 10%, from 10% to 50%, from 10% to 25%) of the maximum emission current density of article 300 when article 300 is used as the tip in the gas field ion source. Typically, the maximum emission current density of article 300 when article is used as the tip in the gas field ion source is at most 10 $pA/Å^2$ (e.g., at most 1.0 $pA/Å^2$, at most 0.1 $pA/Å^2$), and/or at least 0.001 $pA/Å^2$ (e.g., at least 0.01 $pA/Å^2$, at least 0.1 $pA/Å^2$).

In general, coating 310 is formed of an electrically conductive material, such as carbon, a metal or an alloy. Exemplary metals include gold, silver, palladium, osmium, tungsten, tantalum, iridium, rhenium, niobium, platinum and molybdenum. Exemplary alloys include at least two metals selected from carbon, gold, silver, palladium, osmium, tungsten, tantalum, iridium, rhenium, niobium, platinum and molybdenum.

In general, coating 310 can be formed by any desired process. Exemplary processes include evaporation, liquid deposition, electrochemical deposition, chemical vapor deposition, physical vapor deposition, molecular beam deposition, plasma deposition.

In some embodiments, the material forming the coating is disposed on surface 102 only at region 106. In certain embodiments, this can be achieved by blocking regions 104 and 108 of surface 102 from exposure to the material that forms layer 310 (e.g., when the material is in a gaseous or solid state) during the formation of coating 310.

In certain embodiments, the material forming the coating is disposed on more than only region 106 of surface 102 (e.g., on region 108 of surface 102 and/or on region 104 of surface 102), followed by removal of the material from other than region 106 of surface 102. For example, the material that forms coating 310 may be disposed on more than region 104 of surface 102, and the article may be subsequently treated (e.g., by evaporation, sputtering, and/or etching) to remove the material from surface 102 in other than region 106. In some embodiments, the removal of the material can be achieved by heating the article (e.g., to cause thermally-induced evaporation of the material from selected regions of surface 102). In certain embodiments, the removal of the material can be achieved by applying an electric field of appropriate strength to tip 100 (e.g., by using a high electric field near the apex to field evaporate material from region 104 of surface 102).

II. Ion Beam Systems

This section discloses systems and methods for producing ion beams, and detecting particles including secondary electrons that leave a sample of interest due to exposure of the sample to an ion beam. The systems and methods can be used to obtain one or more images of the sample, and/or to modify the sample.

Typically, such ion beams are produced in multipurpose microscope systems. Microscope systems that use a gas field ion source to generate ions that can be used in sample analysis (e.g., imaging) and/or modification are referred to as gas field ion microscopes. A gas field ion source is a device that includes an electrically conductive tip (typically having an apex with 10 or fewer atoms) that can be used to ionize neutral gas species to generate ions (e.g., in the form of an ion beam) by bringing the neutral gas species into the vicinity of the electrically conductive tip (e.g., within a distance of about four to five angstroms) while applying a high positive potential (e.g., one kV or more relative to the extractor (see discussion below)) to the apex of the electrically conductive tip. Optionally, a coating as described herein can be present on the tip.

Figure 4:
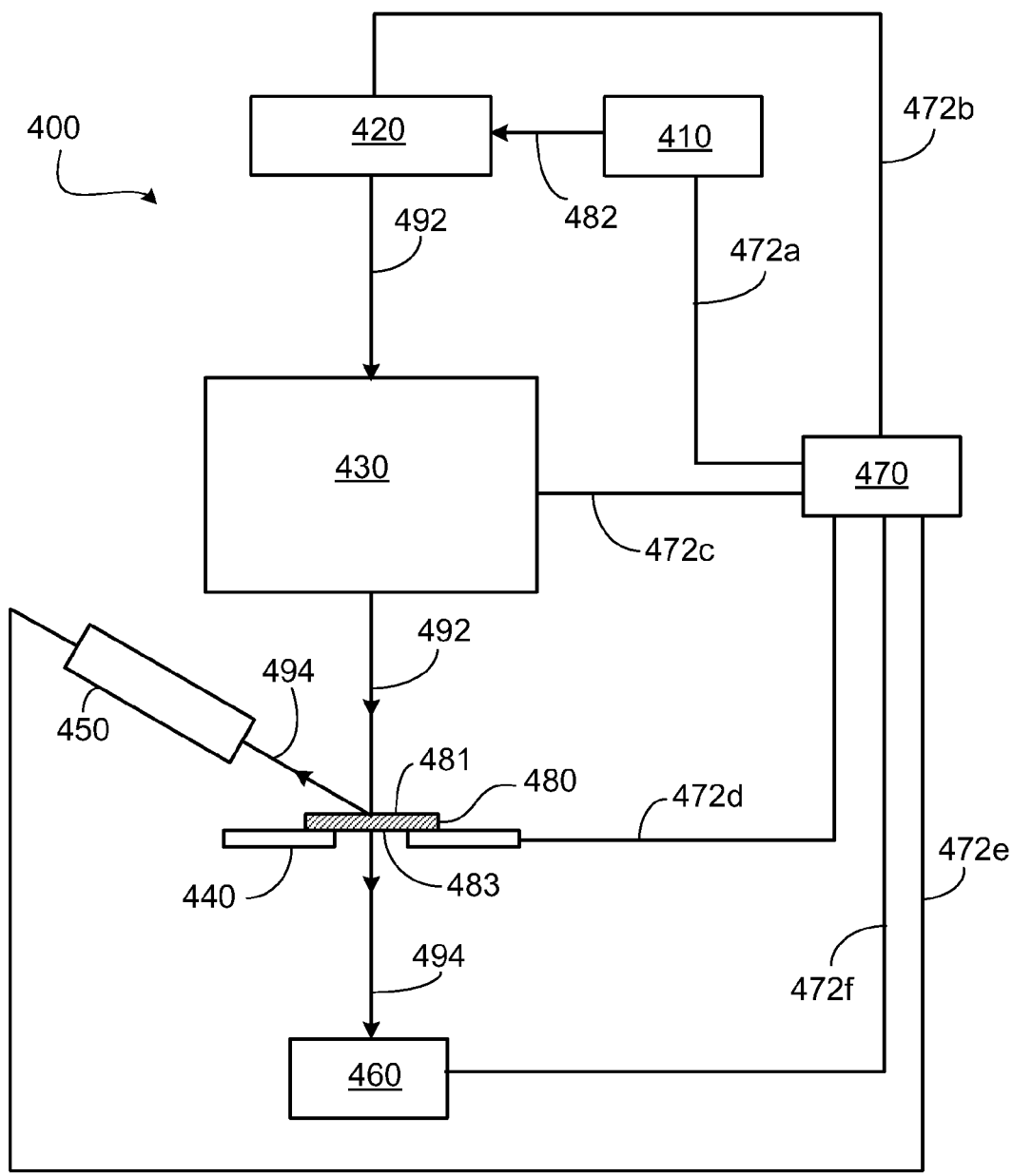
FIG. 4 is a schematic diagram of an ion microscope system.

FIG. 4 shows a schematic diagram of a gas field ion microscope system 400 that includes a gas source 410, a gas field ion source 420, ion optics 430, a sample manipulator 440, a front-side detector 450, a back-side detector 460, and an electronic control system 470 (e.g., an electronic processor, such as a computer) electrically connected to various components of system 400 via communication lines 472a-472f. A sample 480 is positioned in/on sample manipulator 440 between ion optics 430 and detectors 450, 460. During use, an ion beam 492 is directed through ion optics 430 to a surface 481 of sample 480, and particles 494 resulting from the interaction of ion beam 492 with sample 480 are measured by detectors 450 and/or 460. The detected particles may include particles (such as secondary electrons, or auger electrons, or sputtered neutral atoms, or sputtered ions, or fast recoiled neutral atoms, or fast recoiled ions) which already existed within the sample prior to interacting with the ion beam, particles (such as photons, x-rays) which were created through the interaction of the ion beam with the sample, and/or particles (including backscattered helium ions, backscattered helium neutrals, transmitted and undeflected helium ions, transmitted and undeflected helium neutrals, transmitted and deflected helium ions, transmitted and deflected helium neutrals) which where were initially present in the incident ion beam.

In general, it is desirable to reduce the presence of certain undesirable chemical species in system 400 by evacuating the system. Typically, different components of system 400 are maintained at different background pressures. For example, gas field ion source 420 can be maintained at a pressure of approximately $10^{-10}$ Torr. When gas is introduced into gas field ion source 420, the background pressure rises to approximately $10^{-4}$ Torr. Ion optics 430 are maintained at a background pressure of approximately $10^{-8}$ Torr prior to the introduction of gas into gas field ion source 420. When gas is introduced, the background pressure in ion optics 430 typically increase to approximately $10^{-7}$ Torr. Sample 480 is positioned within a chamber that is typically maintained at a background pressure of approximately $10^{-6}$ Torr. This pressure does not vary significantly due to the presence or absence of gas in gas field ion source 420.

Figure 5:
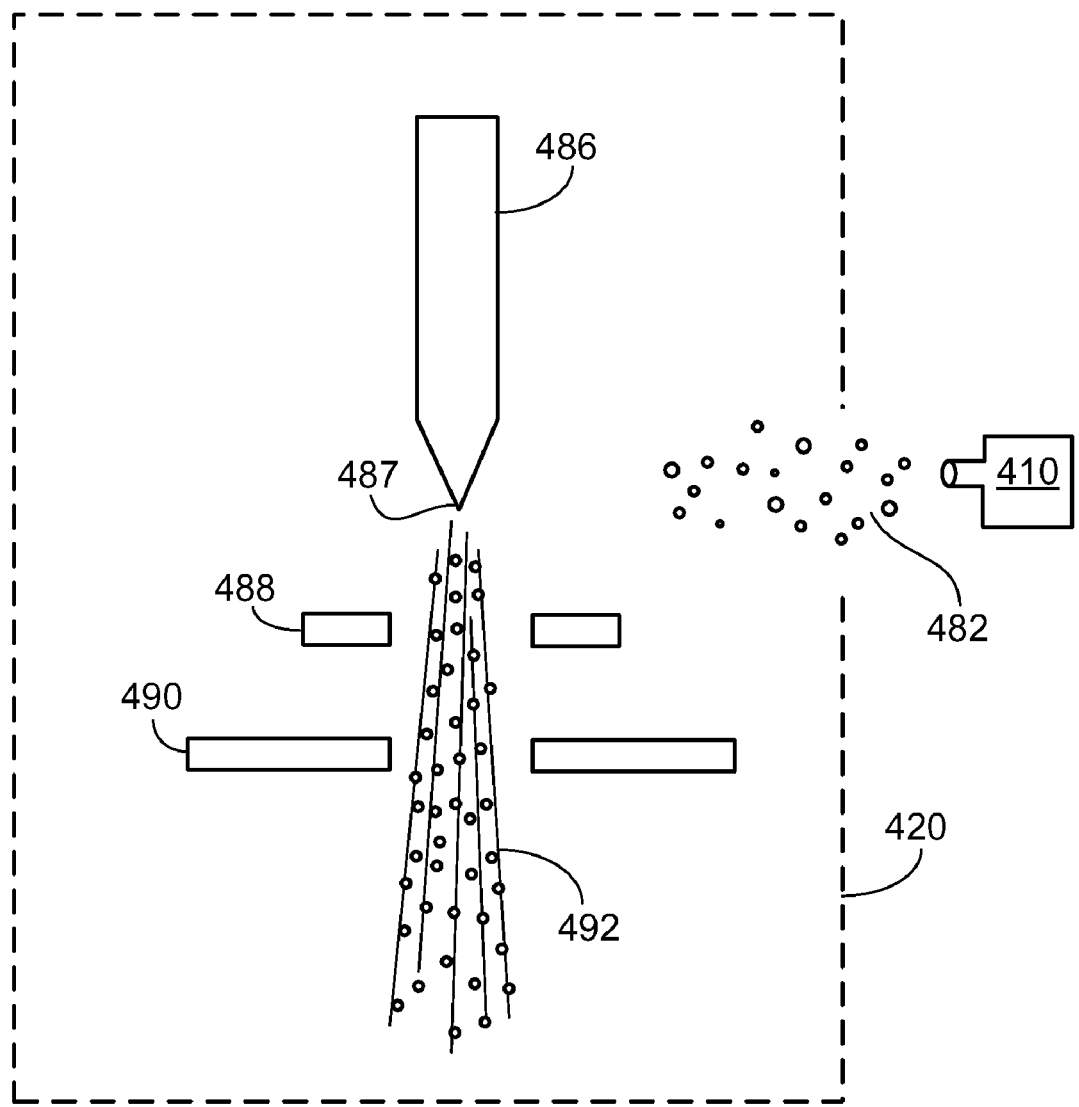
FIG. 5 is a schematic diagram of a gas field ion source.

As shown in FIG. 5, gas source 410 is configured to supply one or more gases 482 to gas field ion source 420. Generally, gas source 410 can be configured to supply the gas(es) at a variety of purities, flow rates, pressures, and temperatures. In general, at least one of the gases supplied by gas source 410 is a noble gas (helium (He), neon (Ne), argon (Ar), krypton (Kr), xenon (Xe)), and ions of the noble gas are desirably the primary constituent in ion beam 492. In general, as measured at surface 481 of sample 480, the current of ions in ion beam 492 increases monotonically as the pressure of the noble gas in system 400 increases. In certain embodiments, this relationship can be described by a power law where, for a certain range of noble gas pressures, the current increases generally in proportion to gas pressure. During operation, the pressure of the noble gas is typically $10^{-2}$ Torr or less (e.g., $10^{-3}$ Torr or less, $10^{-4}$ Torr or less), and/or $10^{-7}$ Torr or more (e.g., $10^{-6}$ Torr or more, $10^{-5}$ Torr or more) adjacent the tip apex (see discussion below). In general, it is desirable to use relatively high purity gases (e.g., to reduce the presence of undesirable chemical species in the system).

Optionally, gas source 410 can supply one or more gases in addition to the noble gas(es). As discussed in more detail below, an example of such a gas is nitrogen. Typically, while the additional gas(es) can be present at levels above the level of impurities in the noble gas(es), the additional gas(es) still constitute minority components of the overall gas mixture introduced by gas source 410. As an example, in embodiments in which He gas and Ne gas are introduced by gas source 410 into gas field ion source 420, the overall gas mixture can include 20% or less (e.g., 15% or less, 12% or less) Ne, and/or 1% or more (e.g., 3% or more, 8% or more) Ne. For example, in embodiments in which He gas and Ne gas are introduced by gas source 410, the overall gas mixture can include from 5% to 15% (e.g., from 8% to 12%, from 9% to 11%) Ne. As another example, in embodiments in which He gas and nitrogen gas are introduced by gas source 410, the overall gas mixture can include 1% or less (e.g., 0.5% or less, 0.1% or less) nitrogen, and/or 0.01% or more (e.g., 0.05% or more) nitrogen. For example, in embodiments in which He gas and nitrogen gas are introduced by gas source 410, the overall gas mixture can include from 0.01% to 1% (e.g., from 0.05% to 0.5%, from 0.08 to 0.12%) nitrogen. In some embodiments, the additional gas(es) are mixed with the noble gas(es) before entering system 400 (e.g., via the use of a gas manifold that mixes the gases and then delivers the mixture into system 400 through a single inlet). In certain embodiments, the additional gas(es) are not mixed with the noble gas(es) before entering system 400 (e.g., a separate inlet is used for inputting each gas into system 400, but the separate inlets are sufficiently close that the gases become mixed before interacting with any of the elements in gas field ion source 420).

Gas field ion source 420 is configured to receive the one or more gases 482 from gas source 410 and to produce gas ions from gas(es) 482. Gas field ion source 420 includes an electrically conductive article 486 with a tip apex 487, an extractor 490 and optionally a suppressor 488. Electrically conductive article 486 is generally configured as described above.

During use, article 486 is biased positively (e.g., approximately 20 kV) with respect to extractor 490, extractor 490 is negatively or positively biased (e.g., from −20 kV to +50 kV) with respect to an external ground, and optional suppressor 488 is biased positively or negatively (e.g., from −5 kV to +5 kV) with respect to article 486. Because article 486 is formed of an electrically conductive material, the electric field of article 486 at apex 487 points outward from the surface of tip apex 487. Due to the shape of article 486, the electric field is strongest in the vicinity of tip apex 487. The strength of the electric field of article 486 can be adjusted, for example, by changing the positive voltage applied to article 486. With this configuration, un-ionized gas atoms 482 supplied by gas source 410 are ionized and become positively-charged ions in the vicinity of apex 487. The positively-charged ions are simultaneously repelled by positively charged article 486 and attracted by negatively charged extractor 490 such that the positively-charged ions are directed from article 486 into ion optics 430 as ion beam 492. Suppressor 488 assists in controlling the overall electric field between article 486 and extractor 490 and, therefore, the trajectories of the positively-charged ions from article 486 to ion optics 430. In general, the overall electric field between article 486 and extractor 490 can be adjusted to control the rate at which positively-charged ions are produced at apex 487, and the efficiency with which the positively-charged ions are transported from article 486 to ion optics 430.

As an example, without wishing to be bound by theory, it is believed that He ions can be produced as follows. Gas field ion source 420 is configured so that the electric field of article 486 in the vicinity of apex 487 exceeds the ionization field of the un-ionized He gas atoms 482, and article 486 is maintained at a relatively low temperature. When the un-ionized He gas atoms 482 are in close proximity to apex 487, the He atoms can be polarized by the electric field of the tip, producing a weakly attractive force between He atoms 482 and apex 487. As a result, He atoms 482 may contact tip apex 487 and remain bound (e.g., physisorbed) thereto for some time. In the vicinity of apex 487, the electric field is high enough to ionize He atoms 482 adsorbed onto apex 487, generating positively charged He ions (e.g., in the form of an ion beam).

In general, ion optics 430 are configured to direct ion beam 492 onto surface 481 of sample 480. Ion optics 430 can, for example, focus, collimate, deflect, accelerate, and/or decelerate ions in beam 492. Ion optics 430 can also allow only a portion of the ions in ion beam 492 to pass through ion optics 430. Generally, ion optics 430 include a variety of electrostatic and other ion optical elements that are configured as desired. By manipulating the electric field strengths of one or more components (e.g., electrostatic deflectors) in ion optics 430, He ion beam 492 can be scanned across surface 481 of sample 480. For example, ion optics 430 can include two deflectors that deflect ion beam 492 in either of two orthogonal directions. The deflectors can have varying electric field strengths such that ion beam 492 is rastered across a region of surface 481.

When ion beam 492 impinges on sample 480, a variety of different types of particles 494 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 450 and 460 are positioned and configured to each measure one or more different types of particles resulting from the interaction between He ion beam 492 and sample 480. As shown in FIG. 4, detector 450 is positioned to detect particles 494 that originate primarily from surface 481 of sample 480, and detector 460 is positioned to detect particles 494 that emerge primarily from surface 483 of sample 480 (e.g., transmitted particles). As described in more detail below, in general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 480. Typically, this information is determined by obtaining one or more images of sample 480. By rastering ion beam 492 across surface 481, pixel-by-pixel information about sample 480 can be obtained in discrete steps.

The operation of microscope system 400 is typically controlled via electronic control system 470. For example, electronic control system 470 can be configured to control the gas(es) supplied by gas source 410, the temperature of article 486, the electrical potential of article 486, the electrical potential of extractor 490, the electrical potential of suppressor 488, the settings of the components of ion optics 430, the position of sample manipulator 440, and/or the location and settings of detectors 450 and 460. Optionally, one or more of these parameters may be manually controlled (e.g., via a user interface integral with electronic control system 470). Additionally or alternatively, electronic control system 470 can be used (e.g., via an electronic processor, such as a computer) to analyze the information collected by detectors 450 and 460 and to provide information about sample 480 (e.g., topography information, material constituent information, crystalline information, voltage contrast information, optical property information, magnetic information), which can optionally be in the form of an image, a graph, a table, a spreadsheet, or the like. Typically, electronic control system 470 includes a user interface that features a display or other kind of output device, an input device, and a storage medium.

Electronic control system 470 can also be configured to implement the pulse counting techniques disclosed herein. For example, electronic control system 470 can be configured to set a threshold level (e.g., in detector 450 and/or 460 in the form of a comparator setting or another hardware device setting, or as a software filter in the electronic control system). Electronic control system 170 can also be configured to count pulses in signals measured by detectors 150 and/or 160, and to determine pixel intensity values based on the counted pulses.

In some embodiments, system 400 can be used in semiconductor fabrication to determine information about the surface and/or subsurface region of a sample during semiconductor article manufacture or at the end of semiconductor article manufacture, and/or to cause chemistry (e.g., ion beam induced chemistry, such as ion beam induced deposition) to occur during manufacture of a semiconductor article. Examples of such uses include maskless lithography, gas assisted chemistry, sputtering, detection of voids, overlay shift registration, critical dimension metrology, line edge roughness, line edge thickness, circuit editing, mask repair, defect inspection, defect review, and/or circuit testing. In certain embodiments, system 400 is used to identify and examine metal corrosion in various devices and material. In some embodiments, system 400 is used to detect defects in read/write heads used in magnetic storage devices such as hard disks. In certain embodiments, system 400 is used to determine elemental and/or chemical compositional information about a biological sample (e.g., in a non-destructive manner). In some embodiments, system 400 is used to determine crystallographic information about a therapeutic agent (e.g., small molecule drug).

While certain embodiments have been disclosed, other embodiments are possible.

As an example, while embodiments have been described in which the coating is formed on only a portion of the surface of the tip, in certain embodiments, the coating can be formed on the entire surface of the tip. Optionally, the coating can be formed on a region of the tip which, when used in as a gas field ion source, has a relatively high average emission current and/or a relatively high average emission current density, and/or which has a relatively low average emission current and/or a relatively low current density. For example, in some embodiments, the coating is formed on regions 104, 106 and 108. In certain embodiments, the coating is formed on regions 104 and 106. In some embodiments, the coating is formed on regions 104 and 108.

As another example, while embodiments have been described in with the coating on the tip is formed of a single layer of a material, in some embodiments the coating can be formed of multiple layers of material. The material from which each layer is formed can generally be selected as desired. In some embodiments, the material of each layer can be the same. In certain embodiments, the material of each layer can be different. In some embodiments, some of the layers can be formed of the same material, and some of the layers can be formed of different material.

As an additional example, while embodiments have been described in which the tip is used as a gas field ion source, in some embodiments, the tip can be used in other systems. For example, the tip can be used as an electron beam source in an electron microscope (e.g., a scanning electron microscope). In general, when used in an electron microscope, a relatively high negative potential is applied to the apex of the tip so that electrons are emitted from the tip. The electrons generated by the tip can pass through appropriate electron optics and reach a sample, where the electrons interact with the sample to create particles that can be detected to provide information about the sample and/or which may be used to cause appropriate chemistry to occur at and/or near the sample. More generally, the tips disclosed herein can be used to generate particles.

Other embodiments are in the claims.

What is claimed is:

1. An article, comprising:
    a first electrically conductive material having a surface; and
    a coating supported by the first electrically conductive material,
    wherein:
        the article is configured to be used as a tip in a gas field ion source;
        the coating is supported by the first electrically conductive material in a region of the article where, when the article is being used as the tip in the gas field ion source, an electric field of the article is insufficient to cause all ions generated by the article to accelerate away from the article without contacting the surface of the first electrically conductive material; and
        the coating is supported by the first electrically conductive material only where, when the article is being used as the tip in the gas field ion source, an average emission current density from the article is at most 50% of a maximum emission current density from the article when the article is being used as the tip in the gas field ion source.

2. The article of claim 1, wherein the coating is supported by the first electrically conductive material only where, when the article is being used as the tip in the gas field ion source, the average emission current density is at most 25% of the maximum emission current density from the article when the article is being used as the tip in the gas field ion source.

3. The article of claim 1, wherein the maximum emission current density from the article when the article is being used as the tip in the gas field ion source is at most 1 pA/Å$^2$.

4. The article of claim 1, wherein the coating comprises a second electrically conductive material.

5. The article of claim 4, wherein the second electrically conductive material comprises an electrically conductive material selected from the group consisting of metals, alloys and carbon.

6. The article of claim 1, wherein the coating is supported by the first electrically conductive material only where an angle between a normal to the surface of the first electrically conductive material and an axis normal to an apex of the first electrically conductive material is least 15°.

7. The article of claim 6, wherein the coating is supported by the first electrically conductive material except within a distance of 200 nm of an apex of the first electrically conductive material as measured along the surface of the first electrically conductive material.

8. A system, comprising:
    the article of claim 7; and
    an optical system configured so that, during use, when the article emits an ion beam, the optical system can direct the ion beam toward a surface of a sample.

9. The article of claim 1, wherein the coating is supported by the first electrically conductive material except within a distance of 200 nm of an apex of the first electrically conductive material as measured along the surface of the first electrically conductive material.

10. The article of claim 1, wherein the article has average full cone angle of from 15° to 45°.

11. The article of claim 1, wherein the article has an average radius of curvature of 200 nm or less.

12. The article of claim 1, wherein the first electrically conductive material comprises an electrically conductive material selected from the group consisting of metals, alloys, carbon, polymers and ceramics.

13. The article of claim 1, wherein the first electrically conductive material comprises a material selected from the group consisting of tungsten, carbon, tantalum, iridium, rhenium, niobium, platinum and molybdenum.

14. The article of claim 1, wherein the first electrically conductive material comprises W(111).

15. The article of claim 1, wherein the first electrically conductive material has a terminal atomic shelf that is a trimer.

16. A system, comprising:
the article of claim 1; and
an optical system configured so that, during use, when the article emits an ion beam, the optical system can direct the ion beam toward a surface of a sample.

17. The article of claim 1, wherein the first electrically conductive material has a terminal atomic shelf comprising 20 atoms or less.

18. An article, comprising:
a first electrically conductive material having a surface; and
a coating comprising a second electrically conductive material, the coating being supported by the first electrically conductive material,
wherein:
the article is configured to be used as a tip in a gas field ion source;
the coating is supported by the first electrically conductive material except within a distance of 200 nm of an apex of the first electrically conductive material as measured along the surface of the first electrically conductive material;
the coating is supported by the first electrically conductive material only where an angle between a normal to the surface of the first electrically conductive material and an axis normal to an apex of the first electrically conductive material is least 15°;
the coating is supported by the first electrically conductive material in a region of the article where, when the article is being used as the tip in the gas field ion source, an electric field of the article is insufficient to cause all ions generated by the article to accelerate away from the article without contacting the surface of the first electrically conductive material; and
the coating is supported by the first electrically conductive material only where an average emission current density from the article is at most 50% of a maximum emission current density from the article when the article is being used as the tip in the gas field ion source.

19. A system, comprising:
the article of claim 18; and
an optical system configured so that, during use, when the article emits an ion beam, the optical system can direct the ion beam toward a surface of a sample.

20. The article of claim 18, wherein the coating is supported by the first electrically conductive material only where the average emission current density is at most 25% of the maximum emission current density from the article when the article is being used as the tip in the gas field ion source.

21. The article of claim 18, wherein the first electrically conductive material comprises a material selected from the group consisting of gold, silver, palladium, osmium, tungsten, tantalum, iridium, rhenium, niobium, platinum and molybdenum, and wherein the second electrically conductive material comprises a material selected from the group consisting of gold, silver, palladium, osmium, tungsten, tantalum, iridium, rhenium, niobium, platinum and molybdenum.

22. The article of claim 18, wherein the first electrically conductive material has a terminal atomic shelf comprising 20 atoms or less.

* * * * *

UNITED STATES PATENT AND TRADEMARK OFFICE
CERTIFICATE OF CORRECTION

PATENT NO. : 8,314,403 B2
APPLICATION NO. : 12/869029
DATED : November 20, 2012
INVENTOR(S) : John A. Notte, IV Page 1 of 1

It is certified that error appears in the above-identified patent and that said Letters Patent is hereby corrected as shown below:

Title Page, Item (66) "Related Application Data": delete "Substitute for application No." and insert --which claims benefit of USSN--.

In the Specification

Column 2, line 20: delete "the article" and insert --The article--.

Signed and Sealed this
Fifteenth Day of October, 2013

Teresa Stanek Rea
*Deputy Director of the United States Patent and Trademark Office*